United States Patent [19]
Sugasawara

[11] Patent Number: 5,936,876
[45] Date of Patent: Aug. 10, 1999

[54] SEMICONDUCTOR INTEGRATED CIRCUIT CORE PROBING FOR FAILURE ANALYSIS

[75] Inventor: Emery Sugasawara, Pleasanton, Calif.

[73] Assignee: LSI Logic Corporation, Milpitas, Calif.

[21] Appl. No.: 08/984,003

[22] Filed: Dec. 3, 1997

[51] Int. Cl.[6] .................................................. G11C 13/00
[52] U.S. Cl. ........................ 365/51; 365/63; 365/230.02
[58] Field of Search .......................... 365/51, 63, 189.02, 365/201, 230.02, 229

[56] References Cited

U.S. PATENT DOCUMENTS

| | | |
|---|---|---|
| 4,937,826 | 6/1990 | Gheewala et al. . |
| 4,975,640 | 12/1990 | Lipp . |
| 5,157,627 | 10/1992 | Gheewala et al. . |
| 5,179,534 | 1/1993 | Pierce et al. . |
| 5,206,862 | 4/1993 | Chandra et al. . |
| 5,230,001 | 7/1993 | Chandra et al. . |
| 5,373,478 | 12/1994 | Komatso et al. ........................ 365/229 |
| 5,436,801 | 7/1995 | Gheewala et al. . |
| 5,471,152 | 11/1995 | Gheewala et al. . |
| 5,495,486 | 2/1996 | Gheewala et al. . |
| 5,532,174 | 7/1996 | Corrigan . |

OTHER PUBLICATIONS

Levitt, Marc E., Sun Microsystems, Inc., "ASIC testing upgraded," IEEE Spectrum, May, 1993, pp. 26–29.

LSI Logic "White Paper RAMBIST Builder," Feb. 1996, Order No. F22003, pp. 1–16.

*Primary Examiner*—Terrell W. Fears

[57] ABSTRACT

Special probe pads are formed within the core of an integrated circuit, such as an ASIC, to provide direct access to internal circuitry for conducting failure analysis. For example, internal probe pads can be provided around an embedded RAM core for bit mapping the RAM core if necessary. An improved probe card is described to provide for accessing these internal probe pads using automated probing machines. The internal probe pads, preferably smaller in size than wire bonding pads, are located in available interstices on the die, preferably without increasing silicon area. Multiplexers can be used to isolate these probe pads during normal operation of the integrated circuit.

17 Claims, 3 Drawing Sheets

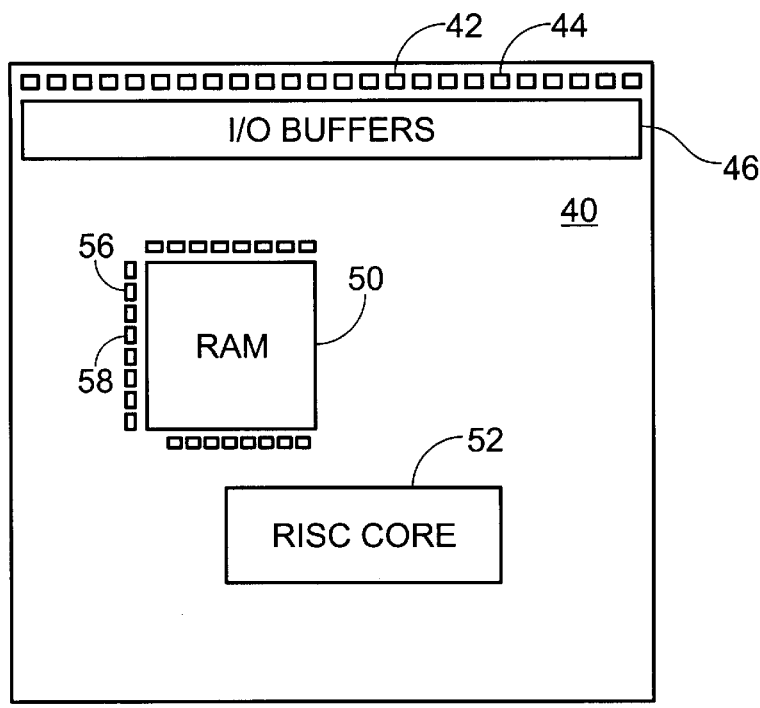
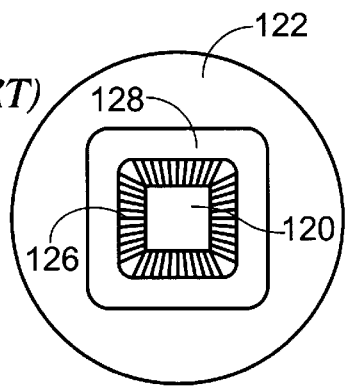
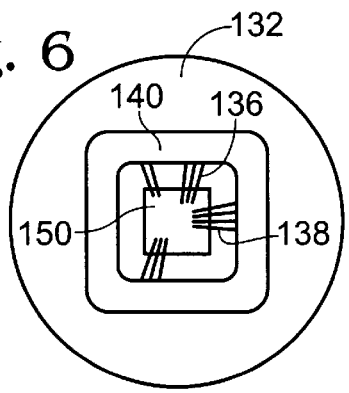
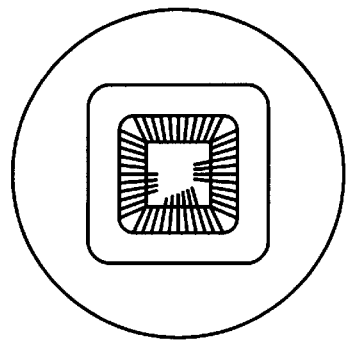

SEMICONDUCTOR INTEGRATED CIRCUIT CORE PROBING FOR FAILURE ANALYSIS

FIELD OF THE INVENTION

The present invention is related to failure analysis of semiconductor integrated circuits and, more specifically, is directed to improvements both in design of integrated circuits and design of probe cards to support failure analysis of ASICs.

BACKGROUND OF THE INVENTION

Semiconductor integrated circuit designs and manufacturing techniques continue to evolve. Great progress has been made over the past generation in all phases of integrated circuit manufacturing so as to improve reliability of the finished products. Reliability of integrated circuits is of paramount importance to all concerned: the manufacturer, the OEM customer, and the end used. Indeed, in some "mission critical" applications, such as medicine or extra terrestrial applications, reliability of such circuits can be a matter of life and death. Even in more pedestrian applications, circuit failures lead to wasted time and expense, not to mention erosion of the manufacturer's reputation.

Although, in general, reliability of integrated circuits has become very high, the relentless push toward higher levels of integration, while maintaining high levels of reliability, presents an ongoing challenge. Part of the integrated circuit manufacturer's quest to improve reliability involves failure analysis—the analysis of failed parts in order to determine what caused the failure. Most manufacturers maintain failure analysis departments, staffed by engineers and other professionals who are skilled in this specialty. Failure analysis typically includes applying selected voltages to circuit inputs and examining selected output voltage levels, either through the use of a functional tester or a mechanical probing system. A mechanical probing system allows the FA technician to apply probes to establish electrical connections to selected locations within the circuitry on a failed chip. However, this work is difficult and time consuming. The technician must visually locate the point of interest on the failed chip under a microscope, among thousands or millions of transistors and perhaps four or five layers of metal, and then manually position a probe at that point. Only a handful of probes can be applied using manual systems due to mechanical space limitations. The limited number of probes available limits the types of failure testing that can be accomplished in this manner.

Automated probe systems and functional testers are known for testing ICs at wafer sort, i.e. before packaging. Typically, an entire silicon wafer with perhaps hundreds of integrated circuits formed on it is functionally tested before the wafer is cut into individual chips or dies for packaging. At this stage, the integrated circuits are tested, one at a time, using a probe machine. The probe machine handles the wafers and positions a "probe card" contacting the particular circuit under test. The probe card has a number of individual probes—typically several hundred in the context of large-scale integrated circuits arranged—for contacting corresponding bonding pads along the peripheral edges of the chip. The probe card provides electrical connection of the chip to an automatic tester machine which measures various I/O ac and dc properties, and otherwise "exercises" the chip to confirm functionality. "Bad" parts are rejected while good ones are packaged (and sometimes retested) and shipped to customers. Wafer sorting systems of the type just described are not used for failure analysis, however, or are used only in limited ways, because failure analysis often requires testing and measurements at internal locations on the die that are not connected to bonding pads.

This problem can be illustrated using embedded memory in an ASIC as an example. Recent advances in semiconductor technology allow the use of increasingly large blocks of memory, such as synchronous RAM or asynchronous RAM cores in ASIC. It is commonplace today for a "system-on-a-chip" to include several megabytes of embedded RAM. Consequently, wafer testing of the ASIC during manufacture must include automatic testing of embedded memories. However, testing of embedded memory blocks in ASIC is very challenging for several reasons. First, a large number of patterns are required for a comprehensive memory test; and the number of patterns grows exponentially with the increasing size of memory. Moreover, accessing memory to apply the test and then to observe the response is a major challenge when the memory is buried deep in the logic.

Four ways to test embedded memories are known: ASIC functional testing, direct I/O multiplexing, boundary scan, and built-in self-test (BIST). In ASIC functional testing, operation of the memory is tested through the functionality of the ASIC. Detailed knowledge of the ASIC is required and, in any event, functional testing of the ASIC is not likely to provide adequate detail for failure analysis in the embedded RAM. Direct I/O multiplexing requires that memory I/Os be brought out to the chip I/Os. Each memory input and output pin is multiplexed to a chip level pin so that patterns can be applied directly. This increases delay at the I/O, and imposes routing constraints, as well as increasing the chip area.

Boundary scanning serially connects the inputs and the outputs of the memory in a boundary scan chain and are provides access to them through a serial chip-level scan input and output pin. Boundary scan works reasonably well for small memories and especially if the design implements scan for the surrounding logic. This method, however, adds delay through the scan cell, increases the number of serial scan test cycles, increases the size of the tester scan memory, and again, is unlikely to provide adequate detail for failure analysis.

Finally, built-in self-test is useful as it provides 100% fault coverage in a reasonable test time. Moreover, software tools are known for automatically synthesizing BIST circuitry for compiled memories. However, BIST circuitry adds additional complexity and area to the chip, as described in more detail with reference to FIG. 1, below. Moreover, BIST may be adequate to provide a "good/bad" decision at wafer probe time, but again it does not provide detailed analysis of the failure mode. Accordingly, when an ASIC is presented for failure analysis, and embedded RAM is the suspect, the manual probing techniques described above are likely to be necessary, even if the chip includes one or more of the embedded memory testing techniques just described. The BIST and/or boundary scan circuitry may do no more than confirm that the embedded memory is bad. The failure analysis engineer must determine the specific cause of the failure, usually beginning by identifying the specific location in the memory array where the failure occurs—called bit mapping.

SUMMARY OF THE INVENTION

In view of the foregoing background discussion, it is an object of the present invention to provide improved designs and methodologies for probing internal core circuitry to support failure analysis of an IC.

Another object of the invention is to increase the number of probe points available for probing internal core circuitry of a failed IC.

A still further object is to minimize, if not obviate, tedious manual probing of failed IC circuits to conduct failure analysis.

According to one aspect of the invention, a semiconductor integrated circuit die has a core circuitry including a plurality of internal nodes; and a plurality of bonding pads located along peripheral edges of the die outside the core circuitry. As in prior art, many of the bonding pads are connected to selected ones of the internal nodes to provide for external electrical connection to the selected internal nodes after packaging of the die. The present invention calls for identifying at least one predetermined node or "probe point" within the core circuitry that is not connected to a bonding pad; and forming a probe pad on the die, electrically connected to the probe point so as to provide for external electrical connection to the probe point by contacting the probe pad to conduct failure analysis of the die. In one example of an application of the invention, the semiconductor integrated circuit die includes an embedded RAM circuit and the probe pad is connected to the RAM circuit so as to support failure analysis of the RAM circuit. The use of several internal probe pads, e.g. connected to RAM address, data and control signal lines, can be used to provide bit mapping of the memory for failure analysis.

These internal or "core" probe pads preferably are sized and located to fit within an existing layout design without adding additional silicon "real estate". A probe pad size of around 5 to 10 microns square is sufficient for the intended purpose of establishing electrical contact with a probe. Thus, while size is not critical to the invention, the probe pads can be much smaller than wire bonding pads.

Another aspect of the invention is a probe card that includes probes arranged for "reaching" into the core area of a die for contacting internal probe pads as described herein. The new probe card can optionally also include probes for contacting selected or all of the bonding pads to support failure analysis.

A further aspect of the invention provides methods and apparatus for isolating the internal probe pads from selected internal circuits, for example using multiplexers, so as to avoid affecting normal operation of the chip. During failure analysis, the muxes are switched to connect up the internal probe pads.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 2 is an enlarged, simplified top plan view of an ASIC with core probe pads as an illustration of the present invention.

FIG. 5 is a simplified top plan view of a prior art wafer sort probe card.

FIG. 6 is a simplified top plan view of a new probe card for failure analysis according to the present invention.

FIG. 7 is a simplified top plan view of an alternative probe card for failure analysis according to another aspect of the present invention.

DETAILED DESCRIPTION OF PRESENTLY PREFERRED EMBODIMENTS OF THE INVENTION

Figure 1:
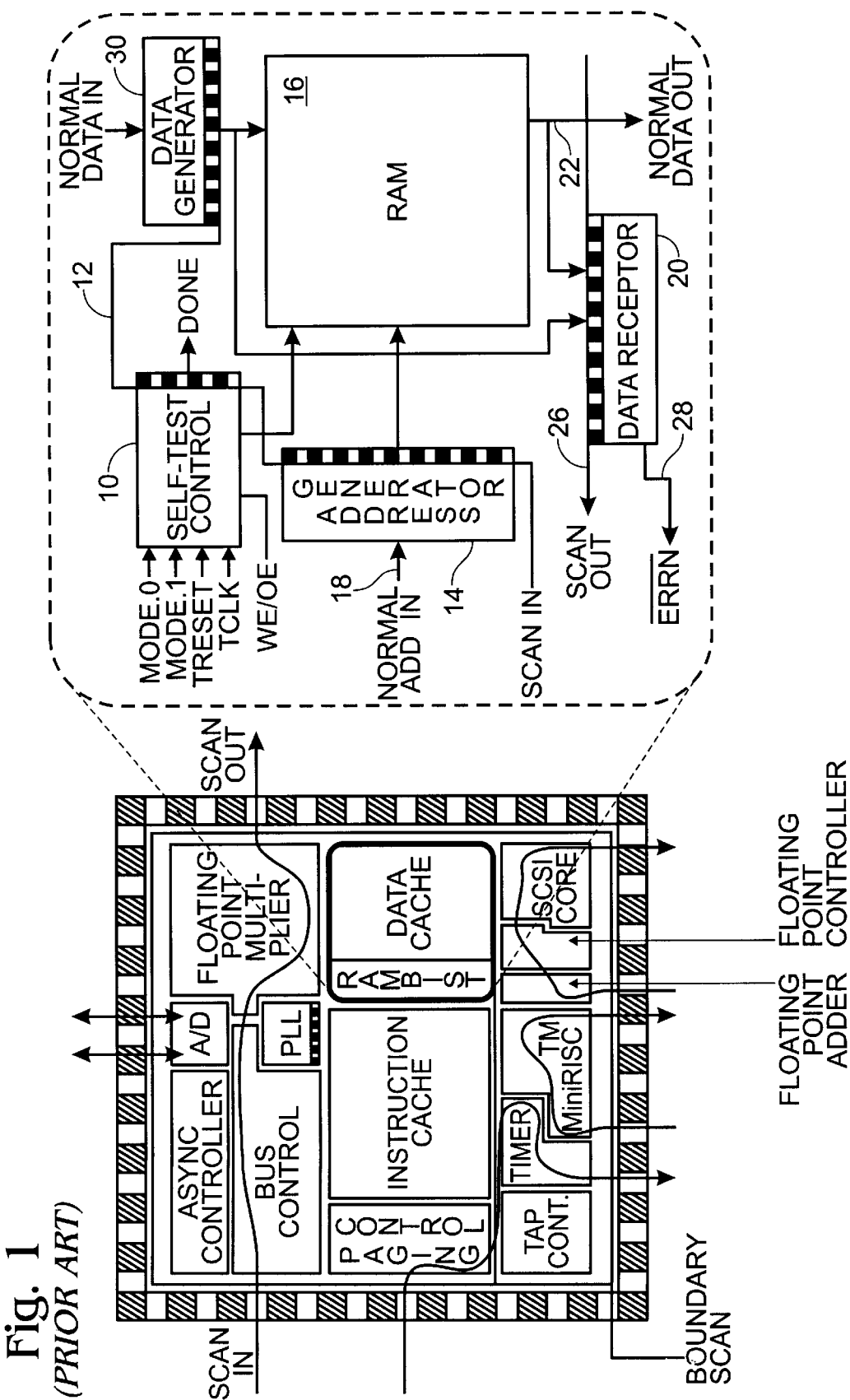
FIG. 1 is an enlarged, simplified top plan view of an ASIC product showing by dashed lines detail of the RAM BIST circuitry.

FIG. 1 is a prior art illustration of an ASIC that includes embedded RAM. On the left side of the figure, this generic top plan view of an ASIC shows various internal core circuits such as an async controller, floating point multiplier, PLL, etc. The right side of the figure shows greater detail of the RAM BIST and data cache portion. The built-in self-test functionality is controlled by self-test control circuitry 10, one output of which is connected as part of a serial scan chain 12. The BIST circuit includes an address generator 14 for address generation during self-testing of the RAM 16. During normal operation, address information at the input 18 is multiplexed through the address generator 14 to the RAM 16. The address generator 14 outputs also are coupled to the serial scan chain as shown. The BIST circuitry also includes a data receptor 20 which can intercept output data from the RAM at output 22, and provide it to the scan chain output at 26 or provide an error flag at 28. The BIST circuit also includes its own data generator 30 for generating input data to the RAM 16 during self test, or alternatively, coupling the normal input data to the RAM for normal operation. By comparing input data provided by the data generator 30 to output data at output 22 in the data receptor 20, the builtin self-test can detect errors in the RAM array 16. While this self-test scheme is helpful for testing at wafer sort, it does not provide a failure analysis engineer the tools necessary to enable him to locate a defect in the RAM easily and specifically.

FIG. 2 is an enlarged, simplified top plan view of an ASIC that incorporates features of the present invention. In FIG. 2, the integrated circuit chip or die 40 includes a plurality of bonding pads, for example bonding pads 42, 44, arranged along the peripheral edges of the die. Although bonding pads are shown only along the top edge in this simplified illustration, in practice, bonding pads typically are provided along all four edges of the chip. It is also common for the chip to include I/O buffer circuitry, indicated as 46, to provide for signal buffering and ESD protection between the bonding pads and the core circuitry. By "core circuitry" in this context we mean all circuitry on the integrated circuit other than the I/O buffers and I/O pads. The core circuitry typically includes a plurality of individual "cores" such as a RISC processor, an I/O channel, a data cache, etc., all interconnected so as to form an operable system on a single chip. In FIG. 2, a RAM core 50 and a RISC core 52 are shown for illustration, although other circuitry is likely to be present in practice. According to the invention, a plurality of internal probe pads, for example probe pads 56, 58, are provided generally adjacent the RAM core 50. These probe pads provide access to the RAM core for failure analysis as will be described in greater detail below. The invention is not limited to providing these internal probe pads for access to embedded RAM, however. The same principle could be used to gain access to other types of cores on the chip as may be needed to conduct failure analysis.

Figure 3:
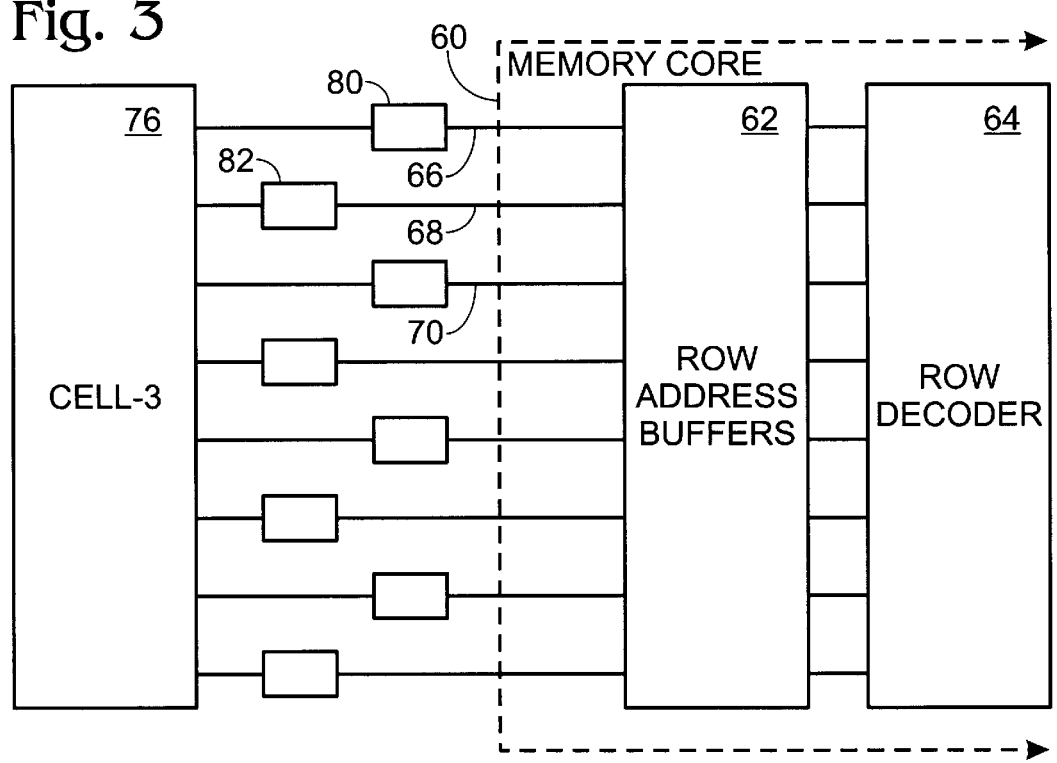
FIG. 3 is further enlarged, simplified top plan view of a portion of an ASIC showing an example of providing core probe pads for addressing an embedded RAM for failure analysis.

FIG. 3 is an enlarged, simplified top-plan view of a portion of an ASIC that includes a memory core indicated by dashed line 60. The memory core 60 includes row address buffer 62 and a row decoder 64 as is common. Row address signal lines 66, 68, etc., provide a row address to the memory core 60. The address signal lines are buffered by the row address buffer 62 and then decoded in the row decoder 64 for driving selected row address lines in the memory array (not shown). The memory address is being provided by circuitry 76 which may be, for example, a logic gate array, RISC core, a cache controller, or other circuitry that addresses the memory. Each of the memory address lines, for example 66, 68, is formed by a conductive material, for example a metal trace, using fabrication techniques that are well known. These traces are typically around 0.5 to 2 microns wide.

In FIG. 3, each of the memory address lines is designated as a "probe point" by which we mean it is an electrical node to which access should be provided for failure analysis. A corresponding probe pad, for example probe pads 80, 82, is provided in electrical connection with each of the respective address lines for this purpose. The probe pads are sized to provide sufficient area for reliable contact with a probe as further explained later. For example, the probe pad 80 may have dimensions on the order of 10 microns square. In FIG. 3, the probe pads are arranged in two offset columns, in order to provide adequate size while maintaining minimum spacing between conductors. In FIG. 2, the probe pads 56, 58, etc., are shown in a linear array. The arrangement or pattern formed by the probe pads is not critical, and will vary depending upon the layout and available area in a given design. The probe pads can be around 5 to 10 microns square or larger.

Figure 4:
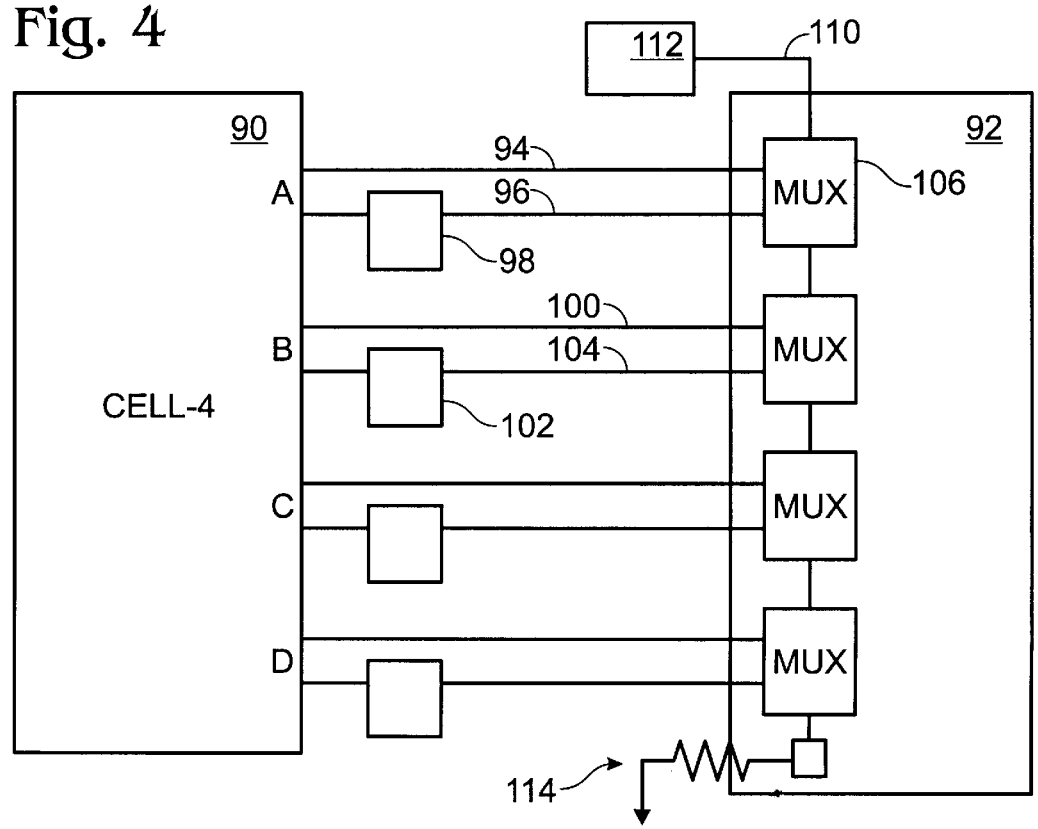
FIG. 4 is further enlarged, simplified top plan view of a portion of an ASIC showing an example of providing multiplexed core probe pads for failure analysis.

FIG. 4 is another top-plan view of a portion of an ASIC illustrating another aspect of the invention. Here, a core 90 provides input signals to another core 92 which may be, for example, address lines input to a memory or some other function. In this case, core 90 outputs four signals labeled A, B, C and D, for input to the core 92. In each case, two output lines are provided. For example, the output signal A is connected from core 90 to core 92 via a conductor 94. The same output signal A also is input to core 92 via a second conductor 96. A probe pad 98 is integrally formed with the conductor 96 for failure analysis probing. Similarly, two conductors are used for connecting each of the other signals B, C and D, from core 90 to core 92. In each case, one of the signal lines provides a direct connection, like conductor 100, while the second conductor includes an enlarged probe pad such as 102.

In the core 92 (or adjacent to it), a series of multiplexer circuits are provided. Each multiplexer receives the pair of conductors corresponding to a respective one of the input signals, A, B, C or D; for example, MUX 106 receives input signals provided via conductors 94 and 96, both corresponding to the output signal A from core 90. A common control signal is provided to all of the multiplexers via conductor 110 which itself may be connected to a probe pad 112. The control terminal 110 is also connected to pull-down circuitry indicated as 114. The pull-down circuit holds the control signal 110 low during normal operation of the IC. In that state, the multiplexers 106, etc., connect the conductors 94, 100, etc., to the internal circuitry in core 92. Thus, in this state, direct connections with minimal metalization are provided for connecting output signals A, B, C and D into the core 92. In other words, the signal lines 96, 104, etc., that include probe pads are not used. This type of circuitry can be used where the additional metal would cause undesirable effects at the inputs to the core circuitry 92. Conversely, one could arrange multiplexer circuitry at the outputs of core 90 so that the probe pads are not "seen" by the core 90 output circuits, thereby minimizing loading during normal operation. During failure analysis, when the probe pads 98, 102, etc., are required for analyzing failure in the core 90 and/or core 92, a pull-up voltage source is applied to the probe pad 112 thereby pulling up the voltage on control line 110 so as to switch the multiplexers 106, etc., to the alternative state, so that the signal lines 96, 104, etc.

FIG. 5 is a simplified, top-plan view of a probe card of the type typically used in wafer sort applications. The probe card is formed of a rigid, insulative material, such as a polymeric material, and includes a central aperture or cavity 120 sized for receiving an integrated circuit die when the die is mounted in operative relation to the probe card in a probe machine. A plurality of connectors, for example through-plated holes, are formed in an outer peripheral portion 122 of the probe card for electrical connection to a tester apparatus (not shown) when the probe card is in use. A plurality of individual wire probes indicated generally as 126 extend from a region of the substrate 128 adjacent the central cavity 120 toward and overhanging the central cavity. These wire probes are arranged for contacting corresponding bonding pads along the periphery of the integrated circuit die when the die is mounted in operative relation to the probe card within the central cavity 120. As illustrated, the wire probes typically extend from all four sides around the cavity for contacting bonding pads along all four peripheral edges of the die. The wire probes are illustrated only generally, as they are extremely fine. A typical probe card for testing large-scale integrated circuits today includes several hundred individual probes. Each probe is electrically connected to a corresponding connector in the outer peripheral area 122 of the probe card for mechanical and electrical connections to the tester.

FIG. 6 is a similar view of a new probe card wherein at least one of the wire probes is sized and formed so as to extend over the central cavity into a core area of the integrated circuit die when the die is mounted in operative relation to the probe card. In other words, in FIG. 6, a failure analysis probe card 130 includes an outer peripheral region 132 for connection to testing equipment as described before. Here, probe wires, for example probes indicated generally as 136 and 138, extend from an inner portion 140 of the probe card and overhang the central aperture 150 by sufficient distance to reach into the core circuitry of the die. These core probes are sized and positioned for contacting corresponding probe pads within the integrated circuit, such as those pads illustrated as 56, 58 in FIG. 2, or 98, 102, etc., in FIG. 4. This strategy of applying wafer probe card technology to internal failure analysis avoids the problems and limitations of manual probing as described above in the Background section. Although only a few probes are shown here for illustration, in practice a larger number of probes (and corresponding core probe pads), for example 50 or 100, are likely to be used. In the illustrative example of embedded RAM, for example, bit mapping the embedded RAM for failure analysis would require access to the RAM address lines, data lines, read/write control inputs, etc. Accordingly, 20 or 30 internal probe pads may be needed.

FIG. 7 illustrates another probe card which includes both the bonding pad probes like the prior art device shown in FIG. 5, together with internal probes for accessing internal probe pads, like those described with reference to FIG. 6. The combination probe card of FIG. 7 will be advantageous for some applications in which it is necessary to access many or all of the bonding pads for testing the chip.

Internal probe pads can be used in several ways. First, in the context of research and development of integrated circuits, probe pads can be formed as described herein and left open for testing and analysis of integrated circuits which are not packaged. Second, for failure analysis, the internal probe pads are incorporated in products which will be packages and shipped to customers. In this case, the probe pads will be covered by an insulating passivation layer along with a surrounding circuitry in the ordinary course of fabrication. Two alternatives are presented here. The internal probe pads could be "opened" by chemical etching or the like at the same time that the peripheral bonding pads are opened by selective removal of the passivation layer. On the other hand, in some cases it will be preferred to leave the bonding pads covered by the passivation layer. In this case, after a failed device package is opened for failure analysis, the internal probe pads can be accessed by first selectively removing the passivation layer that covers them. This can be conveniently achieved by FIB (focused ion beam) techniques, or other known passivation cutting techniques.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A semiconductor integrated circuit die comprising:
   a core circuitry including a plurality of internal nodes;
   a plurality of bonding pads located along peripheral edges of the die outside the core circuitry and connected to selected ones of the internal nodes to provide for external electrical connection to the selected internal nodes after packaging of the die;
   at least one predetermined probe point within the core circuitry that is not connected to a bonding pad; and
   a probe pad located within the core circuitry and electrically connected to the probe point so as to provide for external electrical connection to the probe point by contacting the probe pad to conduct failure analysis of the die.

2. A semiconductor integrated circuit die according to claim 1 wherein the internal core circuitry includes an embedded RAM circuit and the probe pad is connected to the RAM circuit so as to support failure analysis of the RAM circuit.

3. A semiconductor integrated circuit die according to claim 2 wherein multiple probe pads are formed adjacent the RAM circuit, each probe pad being connected to a respective RAM address line for directly addressing the RAM circuit to support locating a failure in the RAM circuit.

4. A semiconductor integrated circuit die according to claim 2 wherein the internal probe pad has an area in a range of approximately 25 to 100 microns.

5. A semiconductor integrated circuit die according to claim 2 wherein multiple probe pads are formed adjacent the RAM circuit, each probe point pad being connected to a respective RAM data I/O line to support locating a failure in the RAM circuit.

6. A semiconductor integrated circuit die according to claim 2 wherein the probe pad is covered with an insulative passivation layer prior to packaging.

7. An application-specific integrated circuit (ASIC) having a plurality of functional circuit blocks formed on a common substrate, wherein one of the functional circuit blocks is an embedded RAM block, and further comprising:
   a plurality of internal nodes, each connected to one or more of the functional circuit blocks;
   a plurality of bonding pads, variously connected to selected ones of the internal nodes to provide for external electrical connection to the selected internal nodes after packaging of the ASIC;
   at least one predetermined probe point within the embedded RAM block that is not connected to a bonding pad; and
   a probe pad electrically connected to the probe point so as to provide for external electrical connection to the probe point in support of failure analysis of the RAM block.

8. An ASIC according to claim 7 wherein the probe pad is sized to receive a wafer test probe.

9. An ASIC according to claim 7 wherein the probe pad has an area smaller than the bonding pads.

10. An ASIC according to claim 7 wherein multiple probe points are selected and corresponding probe pads are formed about the embedded RAM block so as to enable bit mapping of the RAM block by connecting a programmed tester to the probe pads.

11. A method of conducting failure analysis of an ASIC having one or more internal probe pads comprising the steps of:
    decapping the ASIC;
    selectively removing a passivation layer from the ASIC at least in a region that includes the internal probe pad, thereby exposing the probe pad;
    providing a test probe coupled to an external tester; and
    establishing electrical contact between the test probe and the exposed probe pad so as to establish an electrical connection between the exposed probe pad and the external tester, thereby gaining access to one or more nodes in the ASIC that are not connected to external pins.

12. A method according to claim 11 wherein the internal probe pad is connected to a RAM circuit for accessing the RAM circuit without having to use surrounding logic circuits in the ASIC.

13. A method according to claim 11 wherein the removing step comprises selectively opening the passivation layer with a focused ion beam (FIB).

14. A method according to claim 11 wherein:
    said providing a test probe includes providing a probe card having a plurality of test probes arranged thereon in a predetermined pattern, the test probe pattern including at least one test probe positioned for contacting the exposed probe pad when the probe card is operatively positioned in contact with the ASIC; and
    wherein said applying the test probe comprises moving the probe card into a predetermined position in contacting alignment with the ASIC.

15. An improved integrated circuit probe card for failure analysis comprising:
    a rigid substrate having a central aperture sized for receiving an integrated circuit die when the die is mounted in operative relation to the probe card;
    a plurality of connectors formed in an outer portion of the substrate for electrical connection to a tester apparatus;
    a plurality of individual wire probes fixed to the substrate and extending generally from a region of the substrate adjacent the central aperture in a direction of and overhanging the central aperture for contacting corresponding pads on the integrated circuit die when the die is mounted in operative relation to the probe card;

electrical conductors formed in the substrate for interconnecting each of the wire probes to a corresponding one of the connectors; and wherein at least one of the wire probes is sized and formed so as to extend into a core area of the integrated circuit die when the die is mounted in said operative relation to the probe card for contacting a probe pad formed within said core area of the die.

16. A probe card according to claim 15 wherein the wire probes include a first set of probes arranged for contacting corresponding bonding pads on the die, and a second set of probes for contacting internal probe pads located within the core circuitry on the die.

17. A probe card according to claim 15 wherein all of the wire probes are sized and formed so as to extend into a core area of the integrated circuit die when the die is mounted in said operative relation to the probe card for contacting corresponding probe pads formed within said core area of the die for conducting failure analysis.

* * * * *